United States Patent
Jing et al.

(10) Patent No.: US 6,245,688 B1
(45) Date of Patent: Jun. 12, 2001

(54) DRY AIR/N2 POST TREATMENT TO AVOID THE FORMATION OF B/P PRECIPITATION AFTER BPSG FILM DEPOSITION

(75) Inventors: Yuan-Shing Jing, Taichung; Han-Chung Chen, Pao-Shan Hsiang; Chiarn-Lung Lee, Hsin-chu, all of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/320,762

(22) Filed: May 27, 1999

(51) Int. Cl.[7] .......................... H01L 21/311; H01L 21/31

(52) U.S. Cl. .......................... 438/760; 438/698; 438/778

(58) Field of Search .................................. 438/698, 760, 438/778

(56) References Cited

U.S. PATENT DOCUMENTS

| 4,152,286 | | 5/1979 | Crosson et al. | 252/182 |
|---|---|---|---|---|
| 5,314,848 | | 5/1994 | Yasui et al. | 437/248 |
| 5,405,489 | * | 4/1995 | Kim et al. | 156/643 |
| 5,652,187 | * | 7/1997 | Kim et al. | 437/240 |
| 5,698,473 | | 12/1997 | Ibok et al. | 437/240 |
| 5,783,493 | * | 7/1998 | Yeh et al. | 438/718 |

* cited by examiner

Primary Examiner—John F. Niebling
Assistant Examiner—Alexander G. Ghyka
(74) Attorney, Agent, or Firm—George O. Saile; Stephen B. Ackerman

(57) ABSTRACT

A method to store wafers, immediately after the deposition of a layer of BPSG, into an environment of dry air or dry $N_2$ or dry Ar or a $N_2O$ plasma chamber. This storage can occur over a variable period of time and with a variable delay between BPSG deposition and BPSG flow, dependent on which storage environment is applied. The surface of the deposited layer of BPSG is, in doing so, not exposed to $H_2O$ and the formation of unstable irregularities on the surface of the deposited BPSG is prevented.

27 Claims, 3 Drawing Sheets

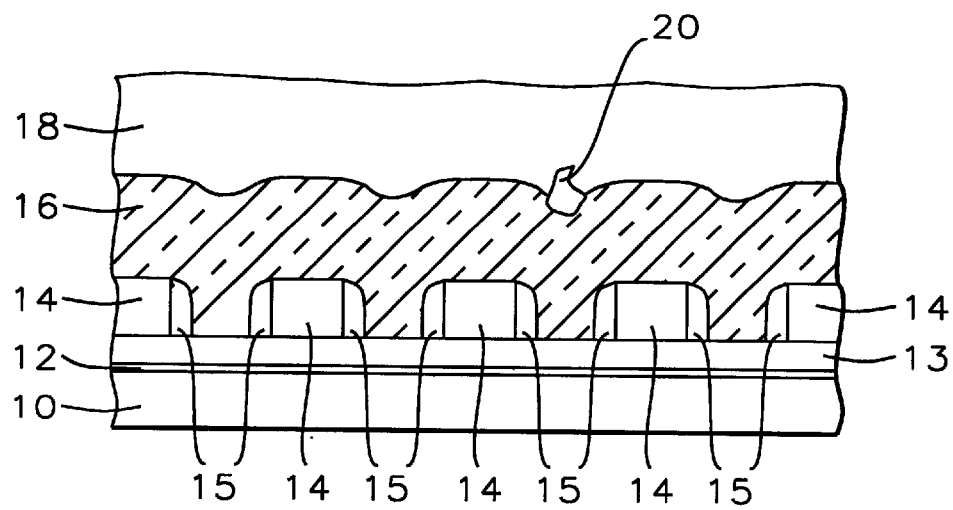
*FIG. 1 – Prior Art*
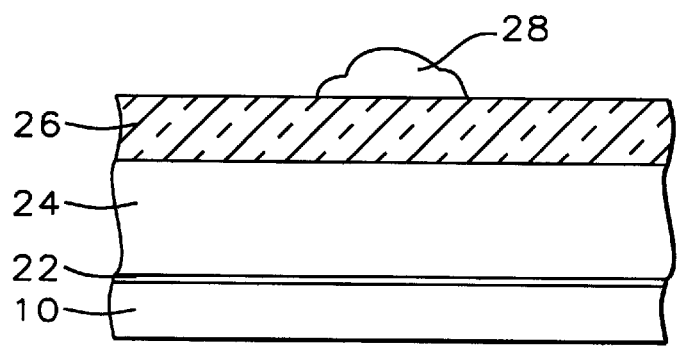
*FIG. 2 – Prior Art*
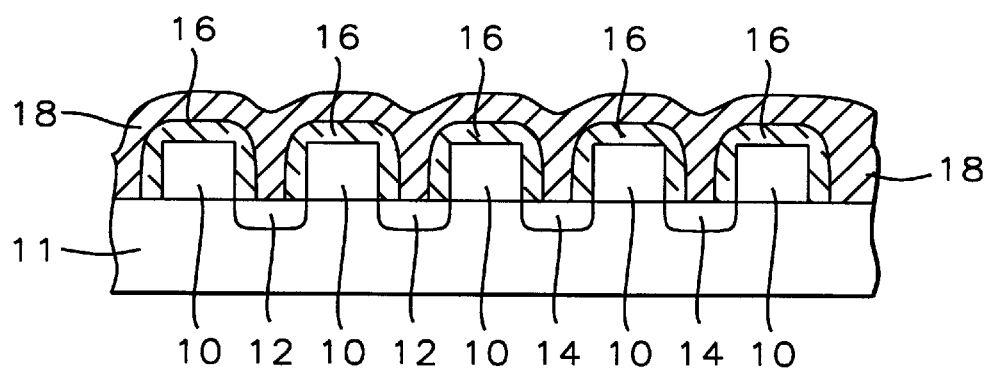
*FIG. 3*

DRY AIR/N2 POST TREATMENT TO AVOID THE FORMATION OF B/P PRECIPITATION AFTER BPSG FILM DEPOSITION

BACKGROUND OF THE INVENTION (1) Field of the Invention

The invention relates to the fabrication of integrated circuit devices, and more particularly, to a method of depositing a boro-phosphate-silicate-glass (BPSG) layer and applying a dry air or dry $N_2$ or dry Ar flow treatment.

(2) Description of the Prior Art

During the manufacturing of semiconductor devices numerous processing steps are taken to create device features such as interconnecting networks, isolation areas, passivation layers and electrode gate structures. During many of these processing steps an important aspect of the creation of a particular feature is the planarity of the surface that is created. Good planarity and the maintenance of good planarity is invariably a key aspect of many of the operations that are used to create a semiconductor device, this planarity can be enhanced or maintained as one of the aspects of a particular process or it can be a process in itself to create a surface with good planarity. Lack of planarity can cause, for instance, problems of depth of focus for the deposition of subsequent layers and problems of step coverage for the deposition of overlying interconnecting conductor lines. Lithographic processes used to create lines and other features of semiconductor devices require, especially in the micron and sub-micron device environment, the ability to establish and maintain sharp and well defined focus. Poor planarity also has a negative effect on required etching steps making it difficult to remove layers of equal thickness.

In maintaining or creating planarity, a planarization method can be of the subtractive type where material is removed from the surface in order to reduce the difference between high and low points within a plane. This removal can be based on mechanical or chemical removal of material. The disadvantage of the removal process is that this process, by its very nature, creates particles that are removed from the surface that is being planarized. These particles, if not completely removed from the environment, can lead to severe problems of surface contamination. Subsequent processing steps that occur at elevated temperatures may trap the contaminants having a serious negative impact on device performance and reliability. These contaminants can also lead to electrical shorts.

Another approach in creating or maintaining good surface planarity is to assure that dielectric layers have and maintain good planarity while the dielectric is being deposited. For this to be the case it is necessary to select dielectric materials and methods of creating the dielectric layer that lead to the desired planarity. Since dielectric layers can be placed at a variety of locations within the construction of a semiconductor device, this approach may lead to a large variety of dielectric materials and methods of dielectric deposition in order to address each of these different dielectric applications. For all of these applications the stated objective is the same, that is to form inter-level dielectrics that have good planarity while at the same time meeting the objective of providing separation and insulation between the layers that surround the dielectric, in many applications these layers are interconnecting conducting lines, bond pads or other levels of metal.

The latter approach of creating inherently planar surface frequently uses boro-phosphate-silicate-glass (BPSG) as a dielectric material. BPSG can be formed as a spin-on material that can be cured after it has been deposited on a surface. BPSG can also be formed within a Chemical Vapor Deposition (CVD) chamber, often used with a plasma enhanced or plasma assisted environment. By heating the deposited BPSG (after it has been deposited) to a temperature of about 900 degrees C., the BPSG can be made to reflow thereby creating a surface of good planarity.

The reflow process has a tendency to create surface imperfections in the form of grains in the surface of the created layer of BPSG. The boron and phosphorous in the BPSG react with oxygen and/or vapor in the surrounding air, the grains that are formed in this manner contain a large amount of phosphorous and oxygen. The chemical reactions proceed as follows:

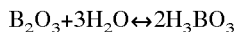
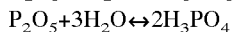
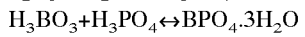

The chemical reaction of flow is:

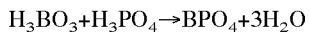

BPSG at a critical temperature range causes the phosphorous and the boron oxide to react with each other at the solid phase and to generate the precipitated grains. This prevents the BPSG from being flat. It is therefore of importance to prevent this formation of surface grains. Two distinct steps can be used to create a BPSG layer: first the BPSG is deposited, second the BPSG is heated so that the BPSG will flow and create good planarity. There is a time difference or lag between these two steps; this time difference may be in the order of several hours or more. It must also be noted at this time that, as shown in the above highlighted chemical reactions, an important contributor to the grain formation on the surface of the BPSG is the presence of $H_2O$ with which the deposited BPSG comes in contact.

It is desirable to reduce the BPSG flow temperature because high temperatures result in excessive diffusion of junctions while metal oxide semiconductor gate oxides cannot be exposed to high temperature processing.

The flow of BPSG depends on film composition, flow temperatures, flow time and the flow ambient environment. The film composition can be altered by increasing for instance the boron concentration of 1 wt % in BPSG, this decreases the BPSG flow temperature by 40 degrees C. However, by increasing the phosphorous content by about 5 wt % in the BPSG, no further decrease in flow temperature is achieved. By further increasing the boron concentration of the BPSG film, this film becomes unstable and hyproscopic resulting in the requirement that the BPSG must be flowed immediately after it has been deposited.

BPSG further has the desirable property of acting as an alkali ion getter and of forming a low stress surface. Care must be taken that the doping limit of BPSG does not exceed certain limits since BPSG can in that case become the source of unwanted diffusion to the underlying silicon. It has been found that BPSG is primarily a source of phosphorous and that the phosphorous out-diffusion increases with increased level of boron.

BPSG is further used for sidewall contouring of contact holes by reflow. In addition to assuring that the contact holes are opened and that silicon-surface damage and contamination are minimized, it is also important to give the contact holes a shape that will result in good step coverage by the metal that is deposited into it. In general, better step coverage will be obtained if the walls of the openings are sloped and the top corners are rounded.

Several different approaches have been pursued to achieve these desired sidewalls profiles. One of the most popular is the reflow of the contact hole dielectric layer. Wafers are exposed to a high temperature step after the holes have been opened. This causes the CVD doped $SiO_2$ layer to flow slightly, producing round corners and sloped sidewalls in the contact holes. BPSG flows at the relatively low temperature of about 900 degrees C. at atmospheric pressure.

From the above it is clear that BPSG is a dielectric material that has many desirable characteristics for its use as a dielectric. Grain formation in the surface of the deposited layer of BPSG must however be prevented while the flow temperature, where possible, must be held relatively low. The addition of boron or phosphorous to the BPSG offers some advantages in lowering the flow temperature of BPSG but these advantages are limited in scope. Defects on the surface of the deposited BPSG have been observed to appear between the lines of polysilicon and to appear after the flow of the BPSG. Changing boron or phosphorous in the BPSG concentration has only limited effect on the formation of irregularities in the surface of the deposited BPSG.

The preferred or target boron to phosphorous ratio in a BPSG film is B/P=2.1/5.1 wt %. This is the ideal condition of boron and phosphorous concentration to prevent the occurrence of BPSG surface irregularities but even under these conditions these irregularities are still observed. Typical ratio is B/P=2.4/5.4 wt %, this ratio is higher than the preferred ratio and the likelihood of surface defects is also higher.

A longer time lag between BPSG deposition and BPSG flow aggravates the problem of defect formation on the surface of the deposited layer of BPSG, for purposes of manufacturing throughput it is desirable to keep this lag time to less than 6 hours. There are however occasions within the manufacturing cycle where a considerable longer lag time is desirable, in some cases a lag time of days is of benefit.

Most of the BPSG surface defects have been observed in the center of the wafer and in ROM areas, these latter areas are areas that have dense polysilicon line concentrations.

FIG. 1 shows a cross section of a wafer 10 on the surface of which has been formed a number of ROM (poly) structures. A gate oxide 12 has been deposited as has a base layer 13 and a pattern 14 of polysilicon lines; spacers 15 (of for instance TEOS/$SiO_2$) have been formed adjacent to the polysilicon lines 14. A layer 16 of BPSG has been deposited over the pattern 14 of polysilicon lines; a final layer 18 of nitride has been deposited over the poly layer. Highlighted on the surface of the poly BPSG film 16 is a grain type surface irregularity 20. These irregularities have been observed most predominantly in areas of heavy poly concentration such as the cross section shown in FIG. 1. The key point to be observed in FIG. 1 is the formation of the precipitation 20 at the surface interface of the deposited layer of BPSG. The structure as shown in FIG. 1 typically can be part of a larger device layout, this larger layout can contain an open area (no ROM structures with poly gates) as is highlighted in the following figure, that is FIG. 2.

FIG. 2 shows a cross section of an open area on the surface of wafer 10 over which a layer 22 of gate oxide and a base layer 24 is formed. A BPSG dielectric layer 26 has been deposited over the base layer 24. Highlighted on the surface of the layer of BPSG is the surface grain type irregularity 28. The area of the wafer that is shown in FIG. 2 is an open area because there is no concentration of poly structures or any other semiconductor device structures present. The key point to be observed in FIG. 2 is the formation of the precipitation 28, again (as in FIG. 1) at the surface interface of the deposited layer of BPSG.

It is understood that the two cross sections as shown in FIGS. 1 and 2 are cross sections of device features that can be contained in one and the same device. In such a layout, the ROM (poly) area and the open (no poly) area share the same layer of BPSG.

It has previously been stated that the presence of $H_2O$ was a catalyst in forming BPSG surface irregularities. The invention teaches a method where this cause is eliminated.

U.S. Pat. No. 5,405,489 (Kim et al.) discloses a method comprising (1) deposit BPSG layer and (2) dry air/$N_2$ treatment. The patent & discusses the $B_2O_2$ precipitate problem.

U.S. Pat. No. 4,152,286 (Crosson et al.) shows a BSPG process.

U.S. Pat. No. 5,314,848 (Yasui et al.) shows a BSPG heat treatment, which is performed in $N_2$.

U.S. Pat. No. 5,698,473 (Ibok et al.) teaches a BPSG process where $N_2$ is used during heating steps.

U.S. Pat. No. 5,783,493 (Yeh et al.) shows a BPSG etchback plasma treatment.

SUMMARY OF THE INVENTION

A principle objective of the invention is to eliminate the formation in air of unstable BPSG surface irregularities after BPSG deposition.

Another objective of the invention is to prevent the conversion of unstable BPSG surface irregularities (occurring after BPSG deposition) into stable or permanent BPSG surface irregularities after BPSG flow.

Another objective of the invention is to be able to extend the time lag between BPSG deposition and BPSG flow without converting unstable surface irregularities into stable BPSG surface irregularities.

In accordance with the objectives of the invention a new method is provided whereby the wafers are, immediately after the deposition of a layer of BPSG, exposed to a controlled environment. This exposure can occur over a certain period of time with the result that a variable delay between BPSG deposition and BPSG flow can be applied. The surface of the deposited layer of BPSG is, in doing so, not exposed to $H_2O$. The formation of unstable irregularities on the surface of the deposited BPSG is thereby prevented.

BRIEF DESCRIPTION OF THE DRAWINGS

FIG. 1 shows a cross section of the ROM area of a stored wafer with a BPSG layer.

FIG. 2 shows a cross section of an open (no poly lines) area of a stored wafer with a BPSG layer.

FIG. 3 shows a cross section of a ROM area with further details of the features created in this area.

DESCRIPTION OF THE PREFERRED EMBODIMENTS

Referring now specifically to FIG. 3, this figure is used to highlight some important points that relate to the invention. These points will be highlighted in the following paragraphs.

FIG. 3 shows a cross-section of a number of poly gates over which a layer of BPSG has been deposited. A layer of metal that connects to the source/drain regions has been deposited over the layer of BPSG. The poly gate structures have been created on a surface 11, typically the surface of a semiconductor substrate.

The details as highlighted in FIG. 3 are as follows:

the poly gates are highlighted with 10 the surface on which the poly gates are created is highlighted with 11 the P+ source/drain regions are highlighted with 12 the N+ source/drain regions are highlighted with 14 the layer of deposited BPSG is highlighted with 16 the layer of metal that makes contacts with the source/drain regions is highlighted with 18.

Using FIG. 3, several parameters that are important to the subject under discussion become readily apparent, as follows:

Rc–P+ is the resistance between the metal layer 18 and the P+ source/drain regions 12

Rc–N+ is the resistance between the metal layer 18 and the N+ source/drain regions 14.

A key point to the understanding of the phenomenon of precipitation (as highlighted in FIGS. 1 and 2) is that inside the precipitation the wt % of the boron/phosphorous (B/P) concentration is above normal or typical concentration of wt % of the boron/phosphorous (B/P). This results in a lower than normal concentration (of B/P) in the immediate vicinity of the precipitation (B/P has been depleted from its normal state into the areas of precipitation). Where the (normal) wt % of B/P is disturbed the (normal) molecular structure is disturbed meaning that the contact profile of the BPSG layer is disturbed for areas around the precipitation. The contact profile can be observed by observing (measuring) the parameters Rc–N+ and Rc–P+, these parameters may potentially increase due to the presence of precipitation. This is further highlighted in FIG. 4a through 4c.

Figure 4A:
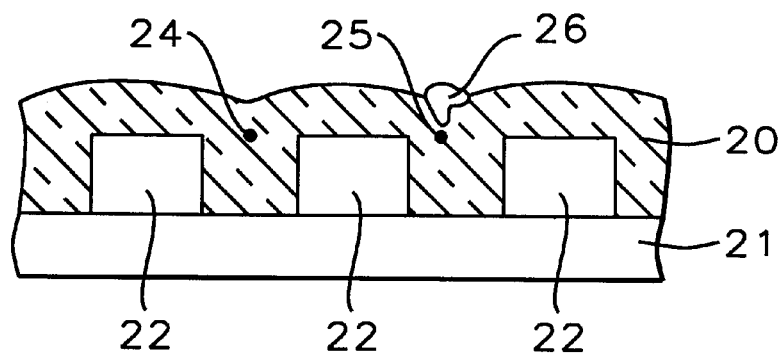
FIGS. 4a, 4b, and 4c shows a cross section of various stages during the creation of metal contacts for ROM devices.

FIG. 4a shows a cross section of a number of poly gates 22 that have been created on a surface 21, 21 is typically the surface of a semiconductor substrate. FIG. 4a shows a cross section immediately after the deposition of the layer 20 of BPSG over the poly line pattern 22. In this layer of BPSG no precipitation has occurred in region 24 while precipitation 26 has occurred in region 25. For region 25, the region immediately adjacent to the precipitation 26, the wt % of B/P has decreased as a result of the precipitation 26.

Figure 4B:
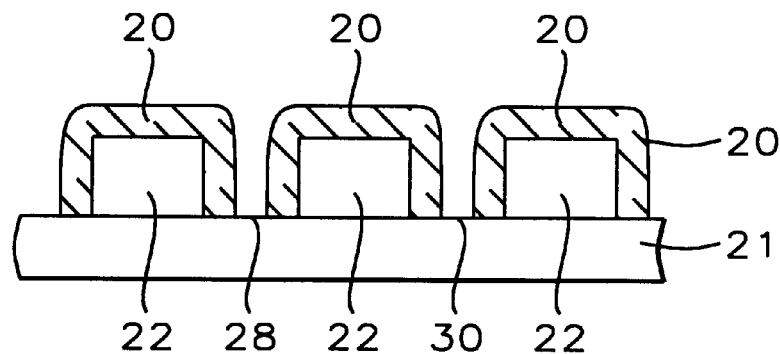

In performing the etch, as shown in FIG. 4b, for the openings of the metal contacts, the contact profile for contact are 28 will be different than the contact profile for contact area 30. Therefore, after the metal 34, FIG. 4c, has been deposited, Rc–N+ and Rc–P+ are also different. From this it can be concluded that measuring Rc–N+ or Rc–P+ provides a valid indicator of the presence or absence of precipitation in the layer of BPSG.

Figure 4C:
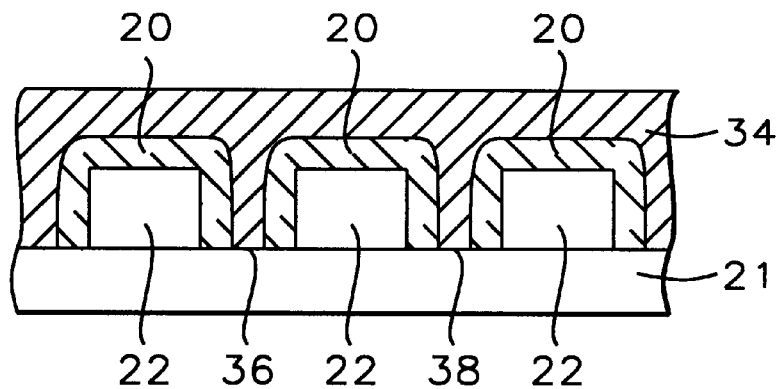

The parameter Conti.–M1 represents the resistance of a metal interconnect that is deposited over the layer of BPSG, see layer 34 in FIG. 4c, for a given length or surface area of this metal line. This parameter Conti.–M1 is also an indication of the presence or absence of precipitation, as follows. Because imperfections (precipitation) attract more wt % of B/P from adjacent BPSG film (thereby lowering the wt % of the adjacent BPSG film), planarization of the BPSG film is poor. The metal for the interconnect to the source/drain regions is deposited over the layer of BPSG. This, in the case of precipitation of the BPSG surface, is a rough surface. This means that the surface of the deposited metal may be rugged resulting in increased resistance of the metal line, or an increase in the parameter Conti.–M1.

The following table shows test results that have been obtained with wafers that have been contained in (exposed to) an ambient in accordance with the invention. The particular ambient that relates to the indicated measurements can be either dry air or $N_2$ or Ar or $N_2O$ plasma or another inert gas. The results obtained are dependent on this ambient that has been applied for storage of the wafers between the processing steps of depositing a layer of BPSG and the subsequent step, delayed by a number of hours, of flowing the deposited layer of BPSG.

It must be remembered that the phenomenon of precipitation is a phenomenon observed by visual inspection. It has, in the scope of the invention, been confirmed, by visual inspection, that the effect of precipitation has been eliminated due to the procedures (of exposing the deposited BPSG layer in a particular manner) of the invention. It therefore remains to be confirmed that the procedures of the invention have no negative impact on the resistance profile (of the poly lines). If there is no negative effect on the resistance profile after the procedures of the invention have been applied and since it is visually observed that BPSG surface precipitation has been eliminated by these procedures, it can safely be concluded that the procedures of the invention provide the solution to the problem of precipitation without incurring any negative effects.

The following table confirms that this is indeed the case. Shown in this table are measurements of Rc–N+ and Rc–P+ for devices that have been treated (in accordance with the invention) and for devices that have not been treated. The measurements for the not treated devices are listed as a top entrance for a given parameter of resistance, the measurements for the treated devices are listed as a bottom entrance for that parameter. The average measurement is indicated for all cases together with the standard deviation for all cases. All measurements have been taken for three different lots; each column represents one lot. Included in the table listed below is the parameter Conti.–M1 that has previously been explained.

To summarize the method of entry:

| Row | Column (lot #) xxx/yyy aaa/bbb, |
|---|---| whereby:

the measurement results for three different lots of devices are listed on a per column basis, the parameters (Rc–N+ or Rc–P+) are listed in the row xxx represents the average value of the parameter for the devices that HAVE undergone post BPSG layer deposition treatment according to the invention followed by a 3 hour delay before BPSG flow yyy represents the standard deviation of the parameter for the devices that HAVE undergone post BPSG layer deposition treatment according to the invention followed by a 3 hour delay before BPSG flow aaa represents the average value of the parameter for the devices that HAVE NOT undergone post BPSG layer deposition treatment according to the invention with a Q-time of 3 hours before BPSG flow bbb represents the standard deviation of the parameter for the devices that HAVE NOT undergone post BPSG layer deposition treatment according to the invention with a Q-time of 3 hours before BPSG flow.

The measurements are as follows:

| | | | |
|---|---|---|---|
| Rc-N+ | 36.81/0.35 | 37.21/0.41 | 36.37/0.12 |
| | 36.74/0.37 | 37.47/0.26 | 37.80/0.59 |
| Rc-P+ | 97.66/2.12 | 110.7/3.72 | 09.33/4.50 |
| | 100.2/3.53 | 113.4/3.00 | 12.20/8.32 |
| Conti.-M1 | 58.39/1.05 | 56.68/0.85 | 57.47/0.62 |
| | 57.82/0.85 | 56.96/1.02 | 57.08/0.65 |

The conclusion may be drawn from the above indicated measurements that there is no noticeable difference in value of resistivity profiles between devices that have been treated and devices that have not been treated in accordance with the invention. This is therefore an indication that the post-treatment method is of value (a value confirmed by visual confirmation of the absence of BPSG surface precipitates after treatment of the BPSG surface in accordance with the invention) and that this treatment has the potential of eliminating the B/P precipitation while not having a negative influence on the contact profile and the planarization of the BPSG film (Conti.–M1).

Two different approaches can be used within the scope of the invention, that is:

1) after deposition of the layer of BPSG, the wafer is stored in an open environment under atmospheric pressure where a laminar flow is introduced of dry Ar (or any other inert gas) or dry air or dry $N_2$ or $N_2O$ plasma.

The laminar flow of dry Ar or dry air or dry $N_2$ is to be extended to a time period of 5 minutes.

The conditions for the $N_2O$ plasma flow are 400 degrees C. for the duration of between about 25 and 35 seconds under a pressure of 2 to 5 Torr with a rf power applied between the range of about 250 and 350 watt.

After the above-indicated exposure of the wafer has been completed, the wafer is left in an open environment until the BPSG must be flowed. This method of treating and storing the wafer results in being able to extend the time delay between the deposition of a layer of BPSG and the flowing of the BPSG to 20 hours.

The BPSG layer created in this manner does not show any sign of precipitation after the BPSG flow has been performed.

2) after deposition of the layer of BPSG, the wafer is placed in an environment of laminar flow of dry Ar (or any other inert gas) or dry Air or dry $N_2$ under atmospheric pressure.

This exposure of the wafer to the indicated environment is not, as exposed to the first method, done for a (relatively) short period of time. The wafer can be kept in this environment for a period of up to 3 days after which the BPSG flow can take place. The BPSG layer created in this manner does not show any sign of precipitation after the BPSG flow has been performed.

Figure 5:
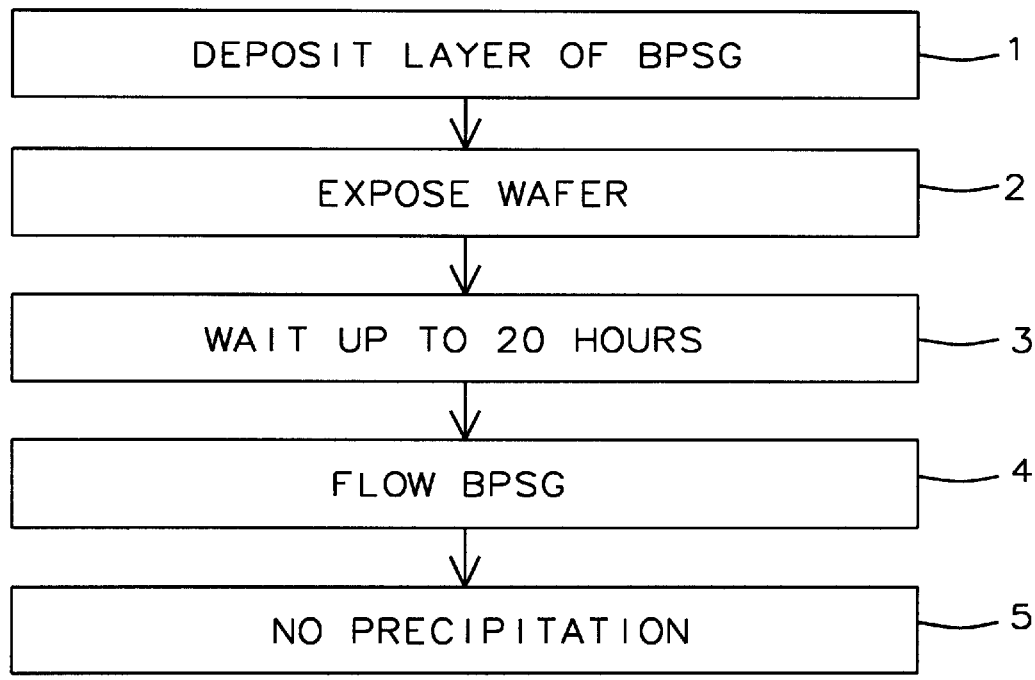
FIG. 5 shows the process flow for storing the wafer for up to 20 hours after BPSG deposition and before BPSG flow.
Figure 6:
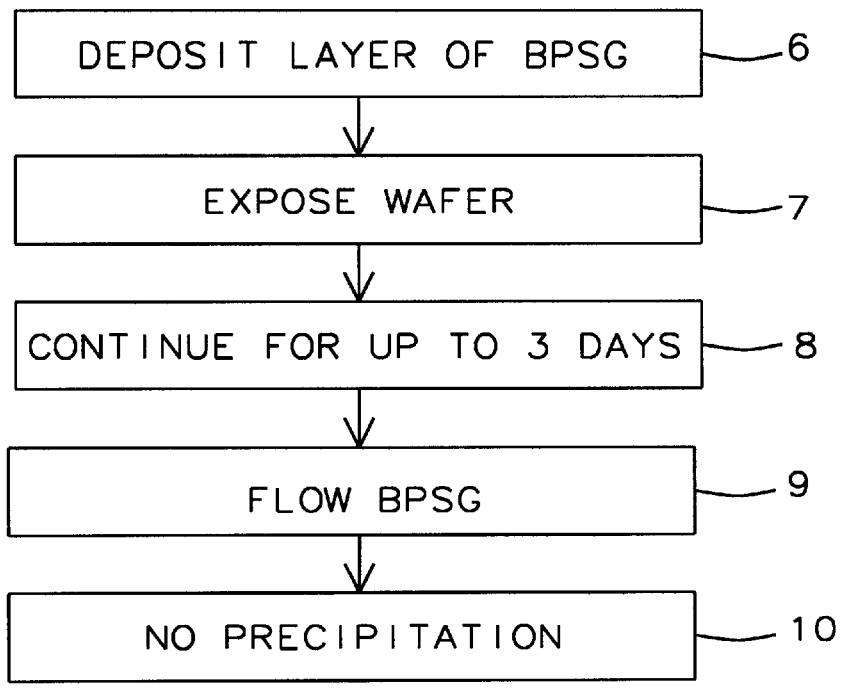
FIG. 6 shows the process flow for storing the wafer for up to 3 days after BPSG deposition and before BPSG flow.

FIGS. 5 and 6 further highlight these different sequences of exposure of the deposited layer of BPSG that are applied between the completion of the deposition of the layer of BPSG and the flow of this layer of BPSG.

FIG. 5 shows a flow chart of the processing steps required within the scope of the invention that allow the lag time between BPSG deposition and BPSG flow to be extended to 20 hours. Step 1 shows the deposition of the layer of BPSG, the wafer on which the BPSG is deposited is then exposed (FIG. 5, step 2 under atmospheric pressure in an open environment to dry air or dry Ar (or any other inert gas) or dry $N_2$ or $N_2O$ plasma. The exposure of the wafer to dry air or dry Ar (or any other inert gas) or dry $N_2$ is to last about 5 minutes, the $N_2O$ plasma treatment need not be extended beyond 30 seconds. After the wafer has undergone the indicated exposure, a time lag of up to 20 hours (FIG. 5, step 3) can be instituted during which the wafer can be stored in an open environment. After this time lag has expired, the BPSG layer can be flowed (FIG. 5, step 4). After this procedure has been followed, no effects of creation of surface irregularities in surface of the flowed BPSG can be observed.

FIG. 6 shows a flow chart of the processing steps required within the scope of the invention that allows the lag time between BPSG deposition and BPSG flow to be extended to 3 days. Step 6 shows the deposition of the layer of BPSG, the wafer on which the BPSG is deposited is then placed in an environment of laminar flow of dry air or dry Ar or dry $N_2$ (FIG. 6, step 7) under conditions of atmospheric pressure and ambient temperature. The wafer can be left in this environment for a period of up to 3 days (FIG. 6, step 8) after which the BPSG can be flowed (FIG. 6, step 9) without any effects of creation of surface irregularities in surface of the flowed BPSG.

While the invention has been particularly shown and described with reference to the preferred embodiments thereof, it will be understood by those skilled in the art that various changes and additions in form and detail can be made without departing from the spirit and scope of the invention.

What is claimed is:

1. A method of fabricating an inter-level dielectric layer, comprising the steps of:

preparing a semiconductor substrate having electrical elements thereon and therein;

depositing a dielectric layer containing boron and phosphorous on said substrate;

exposing said dielectric layer to a controlled environment, said exposing said substrate in a controlled environment is exposing said substrate in an open environment to an element selected from the group consisting of dry air and dry Ar and dry $N_2$ and any other inert gas, under atmospheric pressure and ambient temperature, said exposing not extending beyond 5 minutes after said depositing a dielectric layer, said exposing occurring immediately after said depositing a dielectric layer, incurring a delay, said delay not exceeding 20 hours; and performing a reflow process on said dielectric layer.

2. The method of claim 1 wherein said a dielectric layer contains boro-phosphate-silicate-glass (BPSG).

3. A method of fabricating an inter-level dielectric layer, comprising the steps of:

preparing a semiconductor substrate having electrical elements thereon and therein;

depositing a dielectric layer containing boron and phosphorous on said substrate;

exposing said dielectric layer to a controlled environment, said exposing said substrate in a controlled environment is exposing said wafer to a $N_{20}$ plasma flow at a temperature of about 350 to 450 degrees C. and a pressure between about 2 and 3 Torr and an applied rf power of between 250 and 350 watt, said exposing extending over a period of between about 25 and 35 seconds, said exposing occurring immediately after said depositing of said layer of BPSG;

incurring a delay, said delay not exceeding 20 hours; and performing a reflow process on said dielectric layer.

4. The method of claim 1 which further includes the step of patterning said dielectric layer, said patterning being performed after said performing a reflow process on said dielectric layer.

5. The method of claim 1, said dielectric having a thickness of between 6000 and 9000 Angstrom.

6. The method of claim 1, said depositing a dielectric layer comprising boron and phosphorous being performed using a BPSG process.

7. The method of claim 1, said dielectric layer comprising boron and phosphorous at a ratio of 2.1/5.1 wt %.

8. The method of claim 1, said reflow process of said dielectric layer being performed at a temperature in a range between about 800 and 900 degrees C.

9. The method of claim 1 with the additional step of forming a precipitate on said dielectric, said precipitate being a non-boron precipitate.

10. The method of claim 1, said dielectric comprising boron at concentrations ranging from 4 to 15 wt %.

11. The method of claim 1, said dielectric comprising phosphorous at concentrations ranging from 4 to 15 wt %.

12. The method of claim 1 thereby further including the step of wet cleaning the surface of said dielectric, said wet cleaning being performed immediately prior to said reflow step.

13. The method of claim 12, said wet cleaning step being $H_2SO_4$ boiling.

14. A method of fabricating an inter-level dielectric layer, comprising the steps of:

preparing a semiconductor substrate having electrical elements thereon and therein;

depositing a dielectric layer comprising boro-phosphate-silicate-glass (BPSG) to a thickness of between 6000 and 9000 Angstrom on said substrate, said dielectric layer comprising boron and phosphorous at a ratio of 2.1/5.1 wt %;

storing said substrate in an open environment comprising an element selected from the group consisting of dry air and dry Ar and dry $N_2$ and any other inert gas under atmospheric pressure and ambient temperature, said storage not exceeding a period of 5 minutes after said depositing a dielectric layer, said storing occurring immediately after said depositing of said layer of BPSG;

incurring a time lapse, said time lapse not exceeding 20 hours; and performing a reflow process on said dielectric layer, said reflow process being performed at a temperature in a range between about 800 and 900 degrees C.

15. A method of fabricating an inter-level dielectric layer, comprising the steps of:

preparing a semiconductor substrate having electrical elements thereon and therein;

depositing a dielectric layer comprising boro-phosphate-silicate-glass (BPSG) to a thickness of between about 6000 and 9000 Angstrom on said substrate, said dielectric layer comprising boron and phosphorous at a ratio of 2.1/5.1 wt %;

exposing said substrate to a $N_2O$ plasma flow at a temperature of about 350 to 450 degrees C. and a pressure between about 2 and 3 Torr and an applied rf power of between 250 and 350 watt, said exposing extending over a period of between about 25 and 35 seconds, said exposing occurring immediately after said depositing of said layer of BPSG;

incurring a time lapse, said time lapse not exceeding 20 hours; and performing a reflow process on said dielectric layer, said reflow process being performed at a temperature in a range between about 800 and 900 degrees C.

16. A method of fabricating an inter-level dielectric layer, comprising the steps of:

preparing a semiconductor substrate having electrical elements thereon and therein;

depositing a dielectric layer comprising boro-phosphate-silicate-glass (BPSG) to a thickness of between about 6000 and 9000 Angstrom on said substrate, said dielectric layer comprising boron and phosphorous at a ratio of 2.1/5.1 wt %;

storing said substrate in a laminar flow comprising an element selected from the group consisting of dry air and dry Ar and dry $N_2$ and any other inert gas, said storage not exceeding a period of about 3 days after said depositing a dielectric layer; and performing a reflow process on said dielectric layer, said reflow process being performed at a temperature in a range between about 800 and 900 degrees C.

17. The method of claim 3 wherein said a dielectric layer comprises boro-phosphate-silicate-glass (BPSG).

18. The method of claim 3, further including the step of patterning said dielectric layer, said patterning to occur after said performing a reflow process on said dielectric layer.

19. The method of claim 3, said dielectric having a thickness of between about 6000 and 9000 Angstrom.

20. The method of claim 3, said depositing a dielectric layer containing boron and phosphorous being performed using a BPSG process.

21. The method of claim 3, said dielectric layer containing boron and phosphorous at a ratio of about 2.1/5.1 wt %.

22. The method of claim 3, said reflow process of said dielectric layer being performed at a temperature in a range between about 800 and 900 degrees C.

23. The method of claim 3 with an additional step of forming a precipitate on said dielectric, said precipitate being a non-boron precipitate.

24. The method of claim 3, said dielectric containing boron at concentrations ranging from about 4 to 15 wt %.

25. The method of claim 3, said dielectric containing phosphorous at concentrations ranging from about 4 to 15 wt %.

26. The method of claim 3, including a step of wet cleaning the surface of said dielectric, said wet cleaning being performed immediately prior to said reflow step.

27. The method of claim 26 whereby said wet cleaning step is $H_2SO_4$ boiling.

* * * * *